(12) United States Patent
Huang et al.

(10) Patent No.: US 12,289,117 B2
(45) Date of Patent: Apr. 29, 2025

(54) INPUT CIRCUITRY AND A METHOD FOR RECEIVING AN ANALOG INPUT SIGNAL

(71) Applicants: IMEC VZW, Leuven (BE); KATHOLIEKE UNIVERSITEIT LEUVEN, Leuven (BE)

(72) Inventors: Xiaohua Huang, Leuven (BE); Marco Ballini, Leuven (BE)

(73) Assignees: IMEC VZW, Leuven (BE); KATHOLIEKE UNIVERSITEIT LEUVEN, Leuven (BE)

( * ) Notice: Subject to any disclaimer, the term of this patent is extended or adjusted under 35 U.S.C. 154(b) by 193 days.

(21) Appl. No.: 18/083,913

(22) Filed: Dec. 19, 2022

(65) Prior Publication Data

US 2023/0198543 A1 Jun. 22, 2023

(30) Foreign Application Priority Data

Dec. 21, 2021 (EP) .................................. 21216334

(51) Int. Cl.
*H03M 1/00* (2006.01)
*H03M 1/66* (2006.01)
(Continued)

(52) U.S. Cl.
CPC ........... *H03M 1/662* (2013.01); *H03M 1/687* (2013.01); *H03M 1/742* (2013.01)

(58) Field of Classification Search
CPC ........ H03M 1/742; H03M 3/464; H03M 1/00; H03M 1/06; H03M 1/0607; H03M 1/12; H03M 1/745; H03M 3/30; H03M 3/454; H03M 1/0602; H03M 1/0604; H03M 1/10; H03M 1/1004; H03M 1/1009;
(Continued)

(56) References Cited

U.S. PATENT DOCUMENTS 7,088,178 B1 8/2006 Rosenfeld et al.
7,443,327 B2 * 10/2008 Chida ................. H03M 1/0612
341/135

(Continued)

FOREIGN PATENT DOCUMENTS

EP 2782256 A1 9/2014

OTHER PUBLICATIONS

Lee et al: "A 6.5-µW 10-kHz BW 80.4-dB SNDR $G_m$-C-Based CT ΔΣ Modulator With a Feedback-Assisted $G_m$ Linearization for Artifact-Tolerant Neural Recording", IEEE Journal of Solid-State Circuits, vol. 55, No. 11, pp. 2889-2901, 2020.

(Continued)

*Primary Examiner* — Linh V Nguyen
(74) *Attorney, Agent, or Firm* — MOSER TABOADA

(57) ABSTRACT

An input circuitry for receiving an analog input signal comprises: an input transistor configured to receive the analog input signal on a gate terminal of the input transistor wherein the input transistor is connected to a digital component providing a digital signal, and wherein the input transistor is configured to receive the digital signal on a bulk terminal of the input transistor; wherein the input transistor is configured to provide an output current based on the analog input signal and the digital signal, such that the input transistor provides digital-to-analog conversion of the digital signal received on the bulk terminal.

15 Claims, 9 Drawing Sheets

(51) Int. Cl.
  *H03M 1/68* (2006.01)
  *H03M 1/74* (2006.01)
(58) Field of Classification Search
  CPC ...... H03M 1/108; H03M 1/124; H03M 1/129;
      H03M 1/183; H03M 1/46; H03M 1/66;
      H03M 1/662; H03M 1/687; H03M 1/804;
      H03M 3/356; H03M 3/386; H03M 3/422;
      H03M 3/424; H03M 3/444; H03M 3/494;
          H03F 1/0222; H03F 1/42; H03F
          2200/129; H03F 2200/331; H03F
      2200/451; H03F 2200/72; H03F 2200/91;
          H03F 2203/45112; H03F 2203/45116;
          H03F 2203/45556; H03F 2203/45562;
          H03F 2203/45604; H03F 3/193; H03F
          3/45071; H03F 3/45179; H03F 3/45237;
          H03F 3/45264; H03F 3/45475; H03F
                                        3/45636
  USPC .......................... 341/135, 136, 143, 144, 155
  See application file for complete search history.

(56) References Cited

U.S. PATENT DOCUMENTS

| | | | |
|---|---|---|---|
| 8,791,846 B2 | 7/2014 | Cho et al. | |
| 9,136,854 B1* | 9/2015 | Hong | H03M 1/745 |
| 9,509,326 B1* | 11/2016 | Kauffman | H03M 1/1009 |
| 2009/0079607 A1* | 3/2009 | Denison | A61B 5/316 |
| | | | 341/166 |
| 2009/0174587 A1* | 7/2009 | Ogawa | H03K 17/687 |
| | | | 327/543 |
| 2010/0013569 A1 | 1/2010 | Torres Escajadillo et al. | |
| 2015/0109161 A1* | 4/2015 | Trampitsch | H03K 17/063 |
| | | | 341/172 |
| 2015/0116299 A1* | 4/2015 | Hekmat | H04L 25/03057 |
| | | | 345/212 |
| 2016/0126909 A1* | 5/2016 | Vashishtha | H03K 5/2481 |
| | | | 330/260 |
| 2016/0380646 A1* | 12/2016 | Kauffman | H03M 1/0607 |
| | | | 341/118 |
| 2017/0041019 A1* | 2/2017 | Miglani | H03M 1/0626 |
| 2023/0016043 A1* | 1/2023 | Suntken | H03F 3/45475 |

OTHER PUBLICATIONS

Uehlin et al: "A 0.0023 mm²/ch. Delta-Encoded, Time-Division Multiplexed Mixed-Signal ECoG Recording Architecture With Stimulus Artifact Suppression", IEEE Transactions on Biomedical Circuits and Systems, vol. 14, No. 2, pp. 319-331, 2020.
Intan Technologies, LLC: "RHD2000 Series Digital Electrophysiology Interface Chips", pp. 1-38, 2012.
Mohamad et al: "A Power Minimized 74 fJ/conversion-step 88.6 dB SNR Incremental ΣΔ ADC with an Asynchronous SAR Quantizer", 2017 IEEE International Symposium on Circuits and Systems, pp. 1-4, 2017.
Thankachan et al: "Design of 1-Bit ADC for Delta-Sigma Modulator", International Conference on Emerging Trends in Technology and Applied Sciences, pp. 19-22, 2015.
Yoon et al: "A 0.6-V 540-nW delta-sigma modulator for biomedical sensors", Analog Integr Circ Sig Process, vol. 75, pp. 323-327, 2013.
Roh et al: "A 0.8-V 816-nW delta-sigma modulator for low-power biomedical applications", Analog Integr Circ Sig Process, vol. 63, pp. 101-106, 2010.
Liu et al: "A 0.5-V Ultra-Low-Power Low-Pass Filter with a Bulk-Feedback Technique", 2019 IEEE International Symposium on Circuits and Systems, 2019.
Chang et al: "A 12-bit 150-MS/s Sub-Radix-3 SAR ADC With Switching Miller Capacitance Reduction", IEEE Journal of Solid-State Circuits, vol. 53, No. 6, pp. 1755-1764, 2018.
Pastre et al: "High-precision DAC based on a self-calibrated sub-binary radix converter", 2004 IEEE International Symposium on Circuits and Systems, Abstract, 2004.
Bliss et al: "A Very Small Sub-Binary Radix DAC for Static Pseudo-Analog High-Precision Memory", 1992 Proceedings of the 35th Midwest Symposium on Circuits and Systems, vol. 1, pp. 425-428, 1992.
Chang et al: "A 12b 10MS/s 18.9fJ/Conversion-step Sub-Radix-2 SAR ADC", 2016 International Symposium on VLSI Design, Automation and Test, pp. 1-4, 2016.
Markus et al: "On the Monotonicity and Linearity of Ideal Radix-Based A/D Converters", IEEE Transactions on Instrumentation and Measurement, vol. 54, No. 6, pp. 2454-2457, 2005.
Qiu et al: "A Low Power Pre-Setting Based Sub-Radix-2 Approximation for Multi-bit/cycle SAR ADCs", IEEE Access, vol. 8, pp. 83062-83069, 2020.
Yao et al: "Bulk Voltage Trimming Offset Calibration for High-Speed Flash ADCs", IEEE Transactions on Ciruicts and Systems II: Express Briefs, vol. 57, No. 2, pp. 110-114, 2010.
Akbari et al: "Design and Analysis of an Ultra-Low-Power Second-Order Asynchronous Delta-Sigma Modulator", Circuits Syst Signal Process, 36:4919-4936, 2017.
Laouej et al: "A Very Low Power Delta Sigma Modulator Using Optimized Bulk Driven Telescopic OTA for Biomedical Devices", 2020 IEEE International Conference on Design & Test of Integrated Micro & Nano-Systems (DTS), 2020.
Jeon et al: "A High DR, DC-Coupled, Time-Based Neural-Recording IC With Degeneration R-DAC for Bidirectional Neural Interface", IEEE Journal of Solid-State Circuits, vol. 54, No. 10, pp. 2658-2670, 2019.
Ivanisevic et al: "A 14-ENOB Delta-Sigma-Based Readout Architecture for ECOG Recording Systems", IEEE Transactions on Circuits and Systems—I: Regular Papers, vol. 65, No. 12, pp. 4051-4061, 2018.
Huang et al: "A 0.01-mm² Mostly Digital Capacitor-Less AFE for Distributed Autonomous Neural Sensor Nodes", IEEE Solid-State Circuits Letters, vol. 1, No. 7, pp. 162-165, 2018.
Johnson et al: "An implantable 700μW 64-channel neuromodulation IC for simultaneous recording and stimulation with rapid artifact recovery", 2017 Symposium on VLSI Circuits, pp. C48-C49, 2017.
Muller et al: "A Minimally Invasive 64-Channel Wireless μECOG Implant", IEEE Journal of Solid-State Circuits, vol. 50, No. 1, pp. 344-359, 2015.
Muller et al: "A 0.0013 mm², 5 μW, DC-Coupled Neural Signal Acquisition IC With 0.5 V Supply", IEEE Journal of Solid-State Circuits, vol. 47, No. 1, pp. 232-243, 2012.
Wang et al: "A Compact Quad-Shank CMOS Neural Probe With 5,120 Addressable Recording Sites and 384 Fully Differential Pair Channels", IEEE Transactions on Biomedical Circuits and Systems, vol. 13, No. 6, pp. 1625-1634, 2019.
Dragas et al: "In Vitro Multi-Functional Microelectrode Array Featuring 59 760 Electrodes, 2048 Electrophysiology Channels, Stimulation, Impedance Measurement, and Neurotransmitter Detection Channels", IEEE Journal of Solid-State Circuits, vol. 52, No. 6, pp. 1576-1590, 2017.
Extended European Search Report in EP21216334.9 dated Jun. 14, 2022.

* cited by examiner

INPUT CIRCUITRY AND A METHOD FOR RECEIVING AN ANALOG INPUT SIGNAL

CROSS-REFERENCE TO RELATED APPLICATIONS

The present application claims the benefit of and priority to EP Patent Application Serial No. 21216334.9, filed Dec. 21, 2021, the entire contents of which is incorporated herein by reference.

TECHNICAL FIELD

The present inventive concept relates to an input circuitry and a method for receiving an analog input signal. In particular, the present inventive concept relates to an input circuitry and a method, wherein the analog input signal is to be converted to a digital signal.

BACKGROUND

Acquisition of biopotential signals from a plurality of electrodes (for multi-channel acquisition) poses several challenges. Power and area consumed by each channel needs to be limited in order to enable a compact system. In order to be able to record small amplitude biopotential signals, the signals need to be acquired with low noise. Further, signals recorded from electrodes may have a large direct current (DC) offset caused by electrochemical properties of the interface between electrode and a body of the subject from which the signal is acquired.

The biopotential signals may be acquired using an alternating current (AC) coupling to an input transistor, wherein large input capacitors are used for filtering out DC electrode offset. However, in order to retain low frequency signals of interest, the input capacitors may need to be very large, such that dimensions of circuitry for acquiring the biopotential signals become very large.

According to an alternative, feedback may be provided to the input transistor for canceling the electrode offset. Thus, feedback to the input transistor may be provided through a feedback digital-to-analog converter (DAC). DACs can be used both for canceling the electrode offset and/or as a part of an analog-to-digital converter (ADC) for converting the acquired biopotential signal into digital format.

However, DACs may contribute to significant area and/or power consumption. Further, the DACs may inject noise into the system so as to affect quality of acquiring signals.

Thus, there is a need for an improved input circuitry for acquiring of analog input signals, having limited requirements of power and area consumption, and providing a good signal-to-noise ratio.

SUMMARY

An objective of the present inventive concept is to provide an input circuitry that enables a compact circuit with a low power consumption. It is a further objective of the present inventive concept to provide an input circuitry that enables an analog input signal to be acquired with an adequate signal-to-noise ratio.

These and other objectives of the present inventive concept are at least partly met by the invention as defined in the independent claims. Preferred embodiments are set out in the dependent claims.

According to a first aspect, there is provided an input circuitry for receiving an analog input signal, said input circuitry comprising: an input transistor, which is configured to receive the analog input signal on a gate terminal of the input transistor; wherein the input transistor is connected to a digital component providing a digital signal, and wherein the input transistor is configured to receive the digital signal on a bulk terminal of the input transistor; wherein the input transistor is configured to provide an output current based on the analog input signal and the digital signal, such that the input transistor provides digital-to-analog conversion of the digital signal received on the bulk terminal.

It is an insight of the invention, that a digital signal can be provided to the bulk terminal of the input transistor. Thus, the input transistor may itself function as a digital-to-analog converter for the digital signal provided on the bulk terminal, such that there is no need of a DAC in order to convert a digital signal before it is provided to the input transistor. Hereinafter, the digital-to-analog converter provided via the bulk terminal of the input transistor is referred to as a bulk DAC or BDAC.

In this regard, the input circuitry uses the possibility of feeding a digital signal to the input transistor while still avoiding a separate component for providing digital-to-analog conversion. This implies that no additional noise is contributed by the BDAC.

Further, since the digital signal is not summed with the analog input signal in an input node of the input transistor e.g. through a capacitive DAC (CDAC), input impedance of the input circuitry is not impacted by the digital signal provided to the bulk terminal.

Moreover, since the input transistor provides digital-to-analog conversion, the input circuitry may be provided in a very small area and require low power consumption.

The digital signal provided to the bulk terminal may be used as a feedback digital signal, which could e.g. be used for electrode offset compensation or for forming feedback for actual acquired signals. The digital signal need not necessarily provide a feedback signal to the input circuitry, but may rather provide any digital signal for allowing the analog input signal received on the gate terminal to be processed in relation to the digital signal. For instance, the input circuitry may be arranged within an ADC for providing comparison of the analog input signal to a digital threshold.

As used herein, the term "digital component" should be construed as any component that provides a digital output, i.e. an output that have two different levels and may represent a digital "1" or "0". The input transistor may be directly connected to the digital component for receiving the digital signal.

As used herein, the term "bulk terminal" should be construed as a terminal connected to a bulk material in which the input transistor is formed. The bulk terminal may interchangeably be referred to as a body terminal or a back gate of the input transistor.

According to an embodiment, the input circuitry comprises a set of input transistors, wherein each input transistor in the set is configured to receive the analog input signal on the respective gate terminal of the input transistor, wherein each input transistor in the set of input transistors is configured to receive a respective digital signal on the respective bulk terminal based on a unique bit in a multi-bit digital value.

Thanks to using a set of input transistors, the input circuitry enables a multi-bit digital signal to be provided to the bulk terminals of the input transistors. Hence, each input transistor receives a digital signal representing one of two different levels, whereas the input transistors in the set of input transistors will receive different signals depending so that, together, the digital signals received on the bulk terminals of the set of input transistors represents a multi-bit value. This enables multi-bit input to the set of input transistors in order to provide an improved resolution in the input provided on the bulk terminals of the input circuitry.

The gate terminals of the input transistors may all be connected to receive the analog input signal. Thus, there may be a single wire on which the analog input signal is received and all of the gate terminals of the input transistors may be connected to the single wire.

According to an embodiment, channels of the input transistors in the set of input transistors are uniquely dimensioned such that the input transistors form a sequence of increasing dimensions of the channels and wherein the dimensions of the input transistors is adapted to the bit received by the respective input transistors.

The set of input transistors may be configured to provide a combined output. When the channels of the input transistors are uniquely dimensioned, contribution of each of the input transistors in the set to the combined output is different. Thus, an input transistor which is configured to receive a digital signal representing a more significant bit in the multi-bit value may be configured to have a larger contribution to the combined output than an input transistor being configured to receive a digital signal representing a less significant bit in the multi-bit value. This implies that the set of input transistors is configured to provide an output that is based on a multi-bit digital value being received on bulk terminals of the set of input transistors, while the individual signal received on each bulk terminal only may have two possible levels.

The set of input transistors may be configured to be connected in parallel for forming a combined output. Hence, source terminals of the input transistors may be connected to a common node and drain terminals of the input transistors may also be connected to another common node.

The dimensions of the channel of an input transistor may affect a signal level output by the input transistor. Hence, by dimensioning the channel of the input transistor, the contribution of the input transistor to the combined output from the set of input transistors may be controlled.

The dimensions of the channel that may differ between the input transistors may be a width of the channel and/or a length of the channel.

The channels of the input transistors being uniquely dimensioned implies that the dimensions of the channels of the input transistors in the set of input transistors are mutually different. Hence, there is no pair of input transistors in the set of input transistors, wherein the input transistors have the same dimensions of the channels of the input transistors.

The sequence of increasing dimensions need not necessarily be provided in a particular order in a physical lay-out of the input transistors. Rather, there is a logical sequence among the input transistors, such that a sequence of increasing dimensions may be defined.

The relation of the dimensions of the channels between two subsequent input transistors in the sequence may be the same for any two subsequent input transistors in the sequence. Thus, dimensions of the channels of subsequent input transistors in the sequence may be related to each other by a common factor. Further, the common factor may be 2, which would imply that the dimensions of the channels of the input transistors are binary scaled. However, it should be realized that the common factor need not necessarily equal 2. Rather, in embodiments, a value smaller than 2 may be used to provide a sub-binary radix. This may be used to introduce redundancy into digital-to-analog conversion.

Since the relation of a significance of two bits in a sequence is the same, it may be advantageous to use a common factor representing dimensions of channels of subsequent input transistors. However, it should be realized that the output of a transistor may not necessarily be linearly dependent on the dimensions of the channel, such that different relations may be used between different pairs of subsequent input transistors in the sequence.

However, it should be realized that in some embodiments, channels of all the input transistors or some of the input transistors in the set of input transistors may have the same dimensions. This may be useful, for instance, when using a thermometer code for digital-to-analog conversion.

According to an embodiment, the set of input transistors further comprises a fixed-bias input transistor, which is configured to receive the analog input signal on the gate terminal of the input transistor and configured to receive a fixed reference voltage on the bulk terminal.

Whenever a switching between the levels of the digital signal occurs at the bulk terminal of an input transistor, there may be a significant bulk-to-gate coupling. This coupling may be alleviated by using the fixed-bias input transistor and scaling the dimensions of the other input transistors accordingly. Hence, dimensions of the other input transistors may be smaller to reduce an effect of the bulk-to-gate coupling.

The fixed-bias input transistor may thus have larger dimensions than the other input transistors in the set of input transistors. A ratio between width and length of the fixed-bias input transistor may be selected in order to select a decreased input dynamic range of the set of input transistors.

According to an alternative embodiment, the set of input transistors comprises an input transistor, which is not connected to receive the input signal on the gate terminal of the input transistor and is configured to receive a digital signal on the bulk terminal. This may be used for increasing an input dynamic range of the set of input transistors.

According to an embodiment, the input circuitry is formed by fully depleted silicon on insulator (FDSOI) technology.

The use of a digital signal being received on the bulk terminal of the input transistor may be particularly advantageous in FDSOI technology. FDSOI technology allows a wide range of bulk biasing for modulating a transistor threshold voltage, which facilitate modulating the analog input signal of the input circuitry based on the digital signal received on the bulk terminal.

The input transistor may be implemented using flip-well devices, such as negative-type metal-oxide-semiconductor (NMOS) transistors in a negative-type well. This may be advantageous in that a positive voltage may be provided at the bulk terminal. However, it should be realized that a conventional well device may alternatively be used, such as positive-type metal-oxide-semiconductor (PMOS) transistors in a negative-type well.

Further, it should be realized that the input circuitry may be formed in a different technology, such as regular complementary metal-oxide-semiconductor (CMOS) technology, with proper design of bulk biasing. In such case, a voltage range on the bulk terminal may need to be limited to avoid forward biasing source-to-bulk or drain-to-bulk parasitic diodes.

According to a second aspect, there is provided an operational transconductance amplifier comprising the input circuitry according to the first aspect.

Effects and features of this second aspect are largely analogous to those described above in connection with the first aspect. Embodiments mentioned in relation to the first aspect are largely compatible with the second aspect.

The operational transconductance amplifier (OTA) is an amplifier that is configured to receive differential input voltage and produce an output current. Thus, the OTA is a voltage controlled current source.

The OTA is useful in converting analog input signals from an outside world, such as biopotential signals, into digital signals. Thus, the OTA may be useful in an ADC, but it may alternatively be used e.g. in filter applications.

According to a third aspect, there is provided a comparator circuit for processing an analog input signal, said comparator circuit comprising: the input circuitry according to the first aspect; wherein the input transistor of the input circuitry is configured to receive the digital signal based on one or more digital thresholds, wherein the input transistor is configured to form a comparator for comparing the analog input signal to the digital signal.

Effects and features of this third aspect are largely analogous to those described above in connection with the first and second aspects. Embodiments mentioned in relation to the third aspect are largely compatible with the first and second aspects.

Thus, the input transistor may be configured to receive a reference signal on the bulk terminal for allowing the analog input signal to be directly compared to the reference signal in the input transistor. This may be useful for instance in an ADC having an internal DAC, such as an ADC utilizing successive approximation. The comparator circuit may thus be utilized for providing the internal DAC within an ADC.

As mentioned above, the digital signal provided to the bulk terminal of the input transistor of the input circuitry may be used as a feedback digital signal. However, the input circuitry being used in a comparator circuit is an example of the digital signal provided on the bulk terminal not being a feedback digital signal to the input transistor.

According to an embodiment, the operational transconductance amplifier and/or the comparator circuit, comprises a first input circuitry according to the first aspect and a second input circuitry according to the first aspect for receiving a differential analog input signal.

When a differential input signal is received, the two input circuitries receive a respective one of the analog input signals in a pair of input signals forming the differential input signal. Thus, it would be advantageous to handle each of the input signals in the pair of input signals in the same manner. In this respect, it would be advantageous to provide a first input circuitry and a second input circuitry, wherein each of the first and the second input circuitry is configured to receive a respective one of the input signals in the pair of input signals forming the differential input signal.

The input circuitry of the first aspect may be generally utilized in an application using differential input signals. Thus, first and second input circuitries according to the first aspect may be used, wherein each of the first and the second input circuitry is configured to receive a respective one of the input signals in the pair of input signals forming the differential input signal. However, it should be realized that the input circuitry of the first aspect may alternatively be arranged in a single-ended set-up, such that a single-ended analog input signal is provided. Also, it should be realized that the digital signal may be applied to both sides or only to one side of differential inputs. Further, it should be realized that for a single-ended analog input signal, a reference voltage may be applied at a second terminal, and the digital signal may or may not be applied to the second terminal.

According to a fourth aspect, there is provided an analog-to-digital converter (ADC) circuit for converting an analog input signal into a digital representation, said ADC circuit comprising: a quantizer circuit configured to quantize a signal based on the analog input signal, wherein the quantizer circuit includes the input circuitry according to the first aspect.

Effects and features of this fourth aspect are largely analogous to those described above in connection with the first, second, and third aspects. Embodiments mentioned in relation to the fourth aspect are largely compatible with the first, second, and third aspects.

The input circuitry using a BDAC may be advantageously implemented in an ADC circuit. A digital-to-analog converter function may be provided internally within a quantizer circuit and the input circuitry may thus be implemented within the quantizer circuit.

According to an embodiment, the quantizer circuit may include the comparator circuit according to the third aspect. Thus, the input circuitry may be provided within a comparator circuit which may be used within the quantizer circuit of an ADC.

According to an embodiment, the quantizer circuit includes a successive approximation register (SAR) logic.

Using a SAR logic, comparison may be made between an analog input signal and a reference signal from the SAR logic. This reference signal is based on a digital representation and is converted to analog representation for being compared to the analog input signal.

According to an embodiment, the quantizer circuit may comprise a comparator circuit according to the third aspect for comparing the analog input signal to the reference signal from the SAR logic.

Thus, the quantizer circuit may use input transistors receiving a digital signal on the bulk terminal for providing comparison of the analog input signal to a reference signal from the SAR logic. This enables the digital-to-analog conversion of the reference signal from the SAR logic to be provided within the comparator providing a compact circuit.

According to a fifth aspect, there is provided an ADC circuit for converting an analog input signal into a digital representation, said ADC circuit comprising: the input circuitry according to the first aspect; and a quantizer circuit, wherein the quantizer circuit is configured to quantize a signal from the input circuitry for forming a digital quantized signal, wherein the input transistor of the input circuitry is configured to receive the digital signal on the bulk terminal based on the digital quantized signal.

Effects and features of this fifth aspect are largely analogous to those described above in connection with the first, second, third, and fourth aspects. Embodiments mentioned in relation to the fifth aspect are largely compatible with the first, second, third, and fourth aspects.

The input circuitry using a BDAC may be advantageously implemented in an ADC circuit. This implies that the ADC circuit enables feedback signal to be provided to the input transistor(s) without introducing noise nor impacting an input impedance of the input circuitry.

Moreover, since the input transistor provides digital-to-analog conversion, the ADC circuit may be implemented in a very small area and require low power consumption with no need to provide a separate DAC circuit for providing the feedback signal to the input circuitry.

According to an embodiment, the ADC circuit may comprise the OTA according to the second aspect. Thus, according to such embodiment, there is provided an ADC circuit for converting an analog input signal into a digital representation, said ADC circuit comprising: the OTA according to the second aspect; and a quantizer circuit, wherein the quantizer circuit is configured to quantize a signal from the input circuitry for forming a digital quantized signal, wherein the input transistor of the input circuitry of the OTA is configured to receive the digital signal on the bulk terminal based on the digital quantized signal.

According to an embodiment, the ADC circuit comprises an integrator configured to receive a signal from the input circuitry and wherein the quantizer circuit is configured to receive a signal from the integrator.

This implies that the ADC circuit may form a sigma-delta ADC.

In a sigma-delta ADC, a change in an integral of the analog signal is quantized into a digital output. The digital output is passed via a DAC and subtracted from the analog input signal in order to enable identifying a sequence of changes to the integral of the analog input signal to determine a digital representation of the analog input signal. Thus, a feedback is provided from the quantizer circuit to the analog input signal. According to the inventive concept, this feedback from quantizer circuit may be provided directly to the bulk terminal of the input transistor such that an internal DAC in the sigma-delta ADC may be provided by the input transistor of the input circuitry.

The ADC circuit may be configured to provide incremental sigma-delta ADC. This implies that the ADC circuit is reset before each conversion, which makes the ADC circuit particularly suited for processing of multiplexed analog input signals.

The ADC circuit may be configured to comprise an initial input circuitry according to the first aspect, which is configured to receive the analog input signal to be converted into a digital representation and an internal input circuitry, also according to the first aspect, which is configured to be part of the quantizer circuit of the ADC circuit.

The SAR logic and comparator may be used for forming the digital quantized signal which may be used for providing the digital signal on the bulk terminal of the input transistor of the internal input circuitry. It should be realized that this comparator may be formed by a comparator circuit according to the third aspect but is not necessarily formed by such a comparator circuit.

Thus, the ADC circuit may use input transistors receiving a digital signal on the bulk terminal in different parts of the ADC circuit. The input transistors may be used in receiving the analog input signal with a digital feedback signal being provided on the bulk terminal. Further, the input transistors may be used within the quantizer circuit of the ADC circuit.

Thus, an advantage of using input transistors receiving a digital signal on the bulk terminal may be provided in several parts of the ADC circuit.

The quantizer circuit may be implemented as a multi-bit quantizer using a SAR logic. The comparator circuit may thus form a multi-bit SAR quantizer, wherein the reference signal from the SAR logic may be provided to the bulk terminal of an input transistor such that the digital-to-analog conversion of the SAR quantizer is provided by the input transistor.

The multi-bit quantizer may be used in order to lower an oversampling frequency of the analog input signal of the ADC circuit compared to using a single-bit quantizer.

According to an embodiment, the ADC circuit is configured to output a digital signal representing the analog input signal, wherein the read-out circuit further comprises a coarse feedback unit configured to provide a coarse feedback signal based on the digital signal for combining the analog input signal with the coarse feedback signal for electrode offset compensation.

Thus, a coarse feedback signal for electrode offset compensation may be used. This coarse feedback signal may be provided in a conventional manner using e.g. a capacitive DAC, wherein the digital feedback signal is converted to an analog feedback signal before being combined with the analog input signal. This may be used in combination with the input circuitry according to the first aspect, wherein a digital feedback signal is provided to the bulk terminal of the input transistor. Such digital feedback signal to the bulk terminal may provide an electrode offset compensation and/or a feedback from the quantizer circuit of the ADC circuit.

According to a sixth aspect, there is provided a read-out circuit for reading an analog input signal, wherein the read-out circuit comprises an ADC circuit according to the fourth aspect or the fifth aspect, and further comprises at least one chopper configured to provide input chopping for chopper stabilization.

Effects and features of this sixth aspect are largely analogous to those described above in connection with the first, second, third, fourth, and fifth aspects. Embodiments mentioned in relation to the sixth aspect are largely compatible with the first, second, third, fourth, and fifth aspects.

Thus, the ADC circuit of the fourth or the fifth aspect may be included in a read-out circuit. It should be realized that the ADC circuit of the fourth or the fifth aspect may in fact be included in any read-out circuit which does not necessarily include a chopper for chopper stabilization.

The read-out circuit including at least one chopper may be stabilized against drift of electronic components.

The chopper may be used for mitigating flicker noise of the read-out circuit. The flicker noise is particularly large at low frequencies.

The use of a chopper may also imply that an area of the input circuitry may be reduced, as the input transistors may be made smaller. Further, the use of a chopper may provide an improved common-mode rejection ratio of the read-out circuit.

The use of a chopper may reduce input impedance. Thanks to the input impedance of the input circuitry not being impacted by the digital signal provided to the bulk terminal, the input circuitry may be particularly suited for use with a chopper.

According to an embodiment, the read-out circuit further comprises a multiplexing unit configured to receive a plurality of analog input signals from a plurality of sensors and multiplex the plurality of analog input signals into the analog input signal to be received by the input transistor.

The use of a multiplexing unit allows the read-out circuit to be used for a plurality of analog input signals. This implies that the read-out circuit may support e.g. several electrodes in an array of electrodes for providing analog input signals. Further, the read-out circuit may be implemented in a small area, such that the circuitry for processing analog input signals from a plurality of electrodes may be provided in a small area. This may be advantageous in supporting reading of biopotential signals, wherein a circuitry may be configured to be worn by or implanted in a subject. Having small area circuitry ensures that the circuitry is not bulky and is suited for being worn by the subject.

According to a seventh aspect, there is provided a biopotential signal sensor for acquisition of a biopotential signal, said biopotential signal sensor comprising: at least one electrode configured for sensing the biopotential signal, and the read-out circuit according to the sixth aspect, wherein the read-out circuit is connected to the at least one electrode for receiving the biopotential signal sensed by the at least one electrode as the analog input signal to the read-out circuit.

Effects and features of this seventh aspect are largely analogous to those described above in connection with the first, second, third, fourth, fifth, and sixth aspects. Embodiments mentioned in relation to the fifth aspect are largely compatible with the first, second, third, fourth, fifth, and sixth aspects.

When detecting biopotential signals, electrode(s) are worn by or implanted in a subject. Further, the read-out circuit receiving signals from the at least one electrode may also need to be worn by or implanted in the subject.

The read-out circuit may be provided in a small area so as to achieve a compact read-out circuit. This may facilitate having a small size biopotential signal sensor to reduce inconvenience to the subject wearing the sensor.

The biopotential signal sensor may comprise a first and a second electrode, wherein the first electrode is configured to sense the biopotential and the second electrode is connected to a reference potential. The first and the second electrodes may then each be connected to a respective one of input transistors in a pair of input transistors of the read-out circuit.

According to another embodiment, the biopotential signal sensor may comprise one electrode, which is configured to sense the biopotential. This electrode may then be connected to one of the input transistors in the pair of input transistors of the read-out circuit, whereas the other of the input transistors may be directly connected to a reference potential.

It should further be realized that the biopotential signal sensor may comprise an array of read-out circuits for reading out signals from an array of electrodes. Each read-out circuit may support a plurality of electrodes forming a subset of electrodes of the array of electrodes such that the array of read-out circuits supports the entire array of electrodes.

The biopotential signal sensor may for instance be configured to sense a biopotential signal relating to electrocardiography, electroencephalography, electrocorticography, or electromyography.

According to an eighth aspect, there is provided a method for reading an analog input signal, said method comprising: receiving the analog input signal on a gate terminal of an input transistor of an input circuitry; quantizing, by an analog-to-digital converter (ADC) circuit, a signal from the input circuitry for forming a digital quantized signal; providing a digital signal based on the digital quantized signal to a bulk terminal of the input transistor.

Effects and features of this eighth aspect are largely analogous to those described above in connection with the first, second, third, fourth, fifth, sixth and seventh aspects. Embodiments mentioned in relation to the sixth aspect are largely compatible with the first, second, third, fourth, fifth, sixth, and seventh aspects.

Thanks to the method, feedback of the digital quantized signal is provided to the bulk terminal of the input transistor such that the input transistor performs digital-to-analog conversion of the digital quantized signal.

In this regard, the method uses the possibility of feeding a digital signal to the input transistor while avoiding a separate component for providing digital-to-analog conversion. This implies that no additional noise is contributed by the feedback of the digital quantized signal to the input transistor.

Further, since the digital signal is not summed with the analog input signal in an input node of the input transistor e.g. through a CDAC, input impedance of the input circuitry is not impacted by the digital signal provided to the bulk terminal.

Moreover, since the input transistor provides digital-to-analog conversion, the input circuitry may be provided in a very small area and require low power consumption.

According to an embodiment, quantizing of the signal from the input circuitry comprises receiving a signal based on an output from the input transistor on gate terminals of a set of quantizer input transistors, comparing the received signal to a respective reference signal received on a bulk terminal of each quantizer input transistor in the set of quantizer input transistors, wherein the reference signal received by each of the quantizer input transistors is based on a unique bit in a multi-bit digital value from a successive approximation register, SAR, logic, which is configured to receive an output from said comparing.

This implies that multi-bit quantizing may be used in order to lower an oversampling frequency of the analog input signal compared to using a single-bit quantizer.

Further, a multi-bit SAR quantizer may provide digital signals to bulk terminals of the quantizer input transistors, such that the multi-bit quantizer may be provided with no introduction of noise by digital-to-analog conversion and with usage of a small area and low power consumption.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1A:
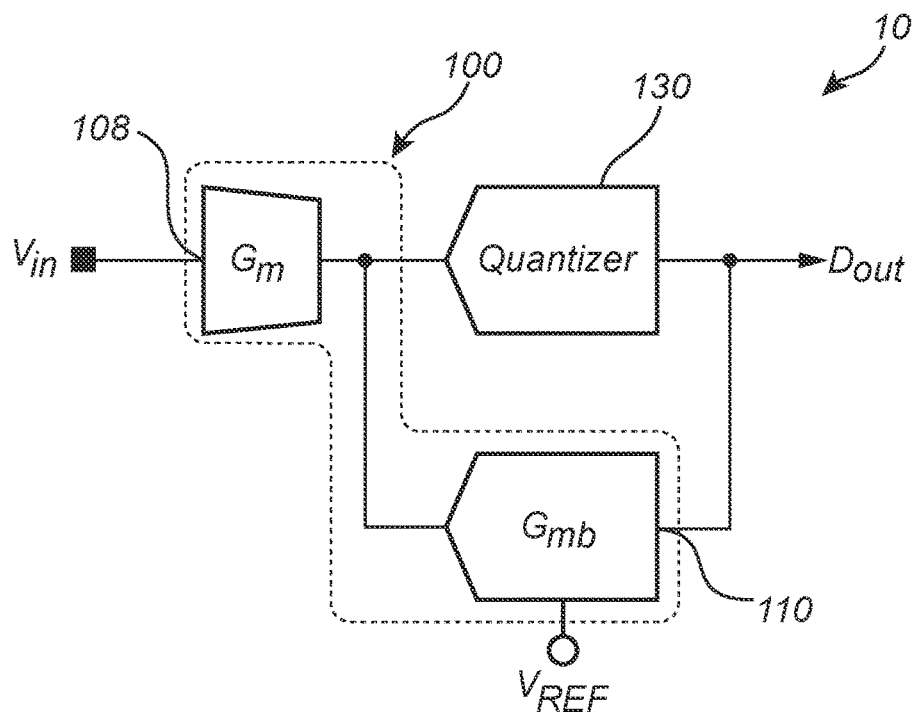
FIG. 1a is a schematic view of an input circuitry according to an embodiment.
Figure 1B:
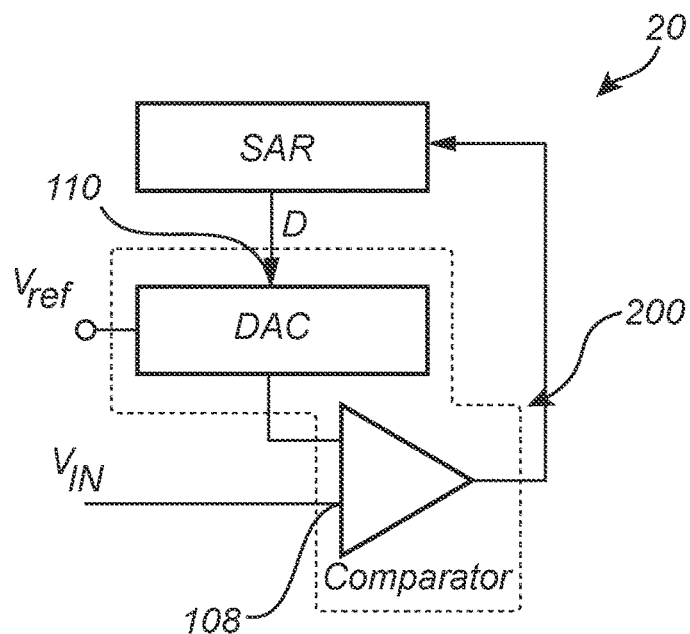
FIG. 1b is a schematic view of an input circuitry according to another embodiment.
Figure 1C:
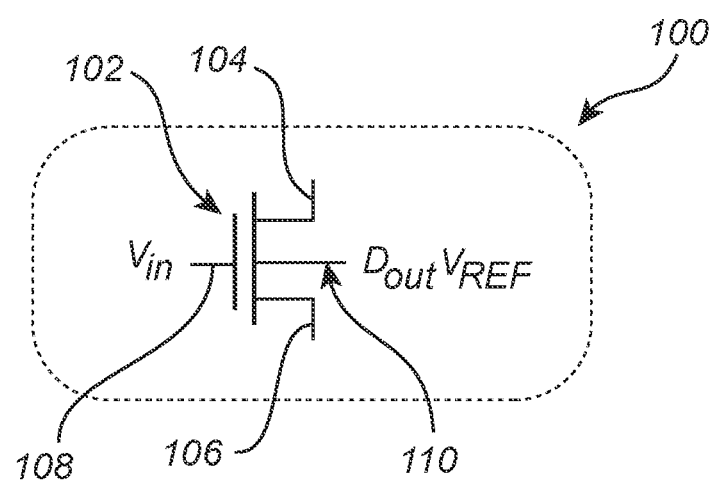
FIG. 1c is a transistor-level schematic of the input circuitry according to an embodiment.

Referring now to FIGS. 1a-b, an input circuitry 100 for receiving an analog input signal will be described. The input circuitry 100 according to a first embodiment is schematically illustrated in FIG. 1a as being arranged in an analog-to-digital converter (ADC) circuit 10, with the input circuitry 100 being shown by dashed lines in FIG. 1a. Similarly, the input circuitry 200 according to a second embodiment is schematically illustrated as being related to a quantizer circuit 20, with the input circuitry 200 being shown by dashed lines in FIG. 1b. Whereas functionality of the input circuitry is illustrated in FIGS. 1a-b, the input circuitry 100 is illustrated in FIG. 1c in terms of a transistor-level schematic, which may apply to each of the first and second embodiments, although reference numeral 100 is used in FIG. 1c.

The input circuitry 100 may in its simplest form comprise a single input transistor 102, comprising a source terminal 106, a drain terminal 104, a gate terminal 108, and a bulk terminal 110.

A drain-to-source current may flow through a conducting channel of the input transistor 102. The drain-to-source current may be controlled by a voltage being applied to the gate terminal 108. The drain-to-source current may further be controlled by a voltage being applied to the bulk terminal 110.

The input transistor 102 is configured to receive the analog input signal on the gate terminal 108. Further, the input transistor 102 is configured to receive a digital signal on the bulk terminal 110.

The input circuitry 100 is configured to output an analog drain-to-source current in dependence of the analog input signal. However, by the digital signal being connected to the bulk terminal 110, the digital signal will influence the analog output from the input transistor 102. This implies that the digital signal will be transformed into the analog output of the input transistor 102 such that digital-to-analog conversion of the digital signal received on the bulk terminal 110 is provided by the input transistor 102.

The digital signal received on the bulk terminal 110 is a signal which may be set to one of two different levels, representing a digital "1" or "0". As shown in FIG. 1c, the signal received on the bulk terminal 110 may be set to $D_{out}*V_{ref}$, which equals $V_{ref}$ if the digital value of $D_{out}$ is "1" and equals 0 if the digital value of $D_{out}$ is "0". However, it should be realized that the signal received on the bulk terminal 110 may not necessarily be "0" for a low logic level. Rather, the digital signal for the low logic level may alternatively be a negative voltage. Thus, the digital signal may according to one alternative be $\pm V_{ref}$.

Since the digital signal is provided on the bulk terminal 110 of the input transistor 102 and a digital-to-analog conversion is provided through the input transistor 102, the input transistor 102 may be referred to as providing a bulk digital-to-analog converter (BDAC).

The input circuitry 100 is illustrated in FIG. 1a as providing a transconductance $g_m$ in relation to a signal on the gate terminal 108 and a transconductance $g_{mb}$ in relation to a signal on the bulk terminal 110.

As shown in FIG. 1a, the digital signal received on the bulk terminal 110 may be a digital feedback signal, which is based on processing of the analog input signal. For instance, as indicated in FIG. 1a, the analog input signal may be output by the input circuitry 100 to a quantizer circuit 130, which produces a digital representation of the analog input signal. The quantizer circuit 130 may provide a digital feedback signal to the input circuitry 100 from the analog-to-digital conversion by the quantizer circuit 130, such that the digital feedback signal may be combined with the analog input signal in the input transistor 102. The input circuitry 100 and the quantizer circuit 130 may be part of an ADC circuit 10, which may provide sigma-delta analog-to-digital conversion.

Since the input circuitry 100 provides a BDAC within the input transistor 102, there is no need for additional components for providing digital-to-analog conversion of the digital feedback signal. This implies that there is no additional noise introduced, since the input transistor 102 which is already part of the input circuitry 100 is further used for providing a BDAC.

Also, since the BDAC is embedded within the input transistor 102, the input circuitry 100 is very compact and may be provided in a very small area and may also require low power consumption.

Further, since the digital signal is not summed with the analog input signal in an input node of the input transistor 102 e.g. through a CDAC, input impedance of the input circuitry 100 is not impacted by the digital signal provided to the bulk terminal 110.

The input circuitry 100 is illustrated in FIG. 1a as being arranged in a circuit wherein a digital component, in this case a quantizer circuit 130, provides a feedback signal to the bulk terminal 110 of the input transistor 102. Hence, the signal received on the bulk terminal 110 may be a digital feedback signal. It should be realized that a digital feedback based on an analog input signal may be provided in various different applications, such that the input circuitry 100 may be used with other circuitries.

However, it should further be realized that the digital signal received on the bulk terminal 110 of the input transistor 102 is not necessarily a feedback signal based on processing of the analog input signal. Rather, as illustrated in FIG. 1b, the input transistor 102 may be configured to form part of a comparator for comparing the analog input signal to the digital signal. The digital signal may then define a threshold, such that the analog input signal is compared to the threshold and the comparator provides an output in dependence of whether the analog input signal is larger than the threshold or not.

The input circuitry 200 is illustrated in FIG. 1b as being part of a quantizer circuit 20 using successive approximation for quantizing the analog input signal into a digital representation. The successive approximation register (SAR) logic may sequentially generate a digital code in order to test bit values against the analog input signal so as to find a digital code that corresponds to a value of the analog input signal. The SAR logic will use a multi-bit digital value and the input circuitry 200 may comprise a set of input transistors 102 as will be described in more detail below. Each input transistor 102 may receive a digital signal based on a unique and mutually different bit in the multi-bit digital value provided by the SAR logic. Each bit may be set to either "0" or "1" such that the input circuitry 100 may be configured to compare the analog input signal to different levels of the threshold.

Since the input circuitry 200 provides a BDAC within the input transistor 102, there is no need for additional components for providing digital-to-analog conversion of the digital value provided from the SAR logic.

It should be realized that a digital signal forming a threshold may be provided in various different applications, such that the comparator of the input circuitry 200 may be used with other circuitries than a SAR logic for providing the digital signal.

Figure 2:
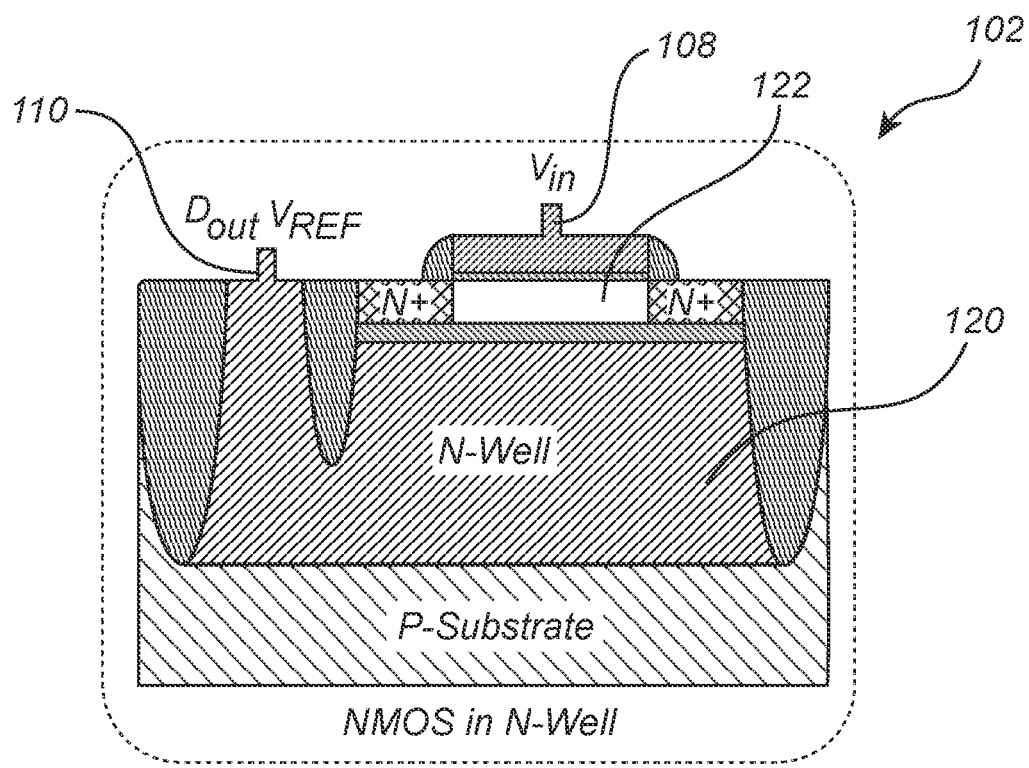
FIG. 2 is a schematic view of an input transistor according to an embodiment being implemented in a fully depleted silicon on insulator technology.

Referring now to FIG. 2, fully depleted silicon on insulator (FDSOI) technology may be used. The input transistor 102 of the input circuitry 100 may be implemented using a flip-well device, wherein a negative-type well 120 and a negative channel 122 is formed so that a negative-type metal-oxide-semiconductor (NMOS) transistor is formed.

The bulk terminal 110 may be provided for forming a contact to bulk material in the n-well. The bulk terminal 110 may be arranged at a common side of the FDSOI substrate with the gate terminal 108 as illustrated in FIG. 2.

The use of a digital signal being received on the bulk terminal 110 of the input transistor 102 may be particularly advantageous in FDSOI technology. FDSOI technology allows a wide range of bulk biasing for modulating a transistor threshold voltage, which facilitate modulating the analog input signal of the input circuitry 100 based on the digital signal received on the bulk terminal 110.

Figure 3:
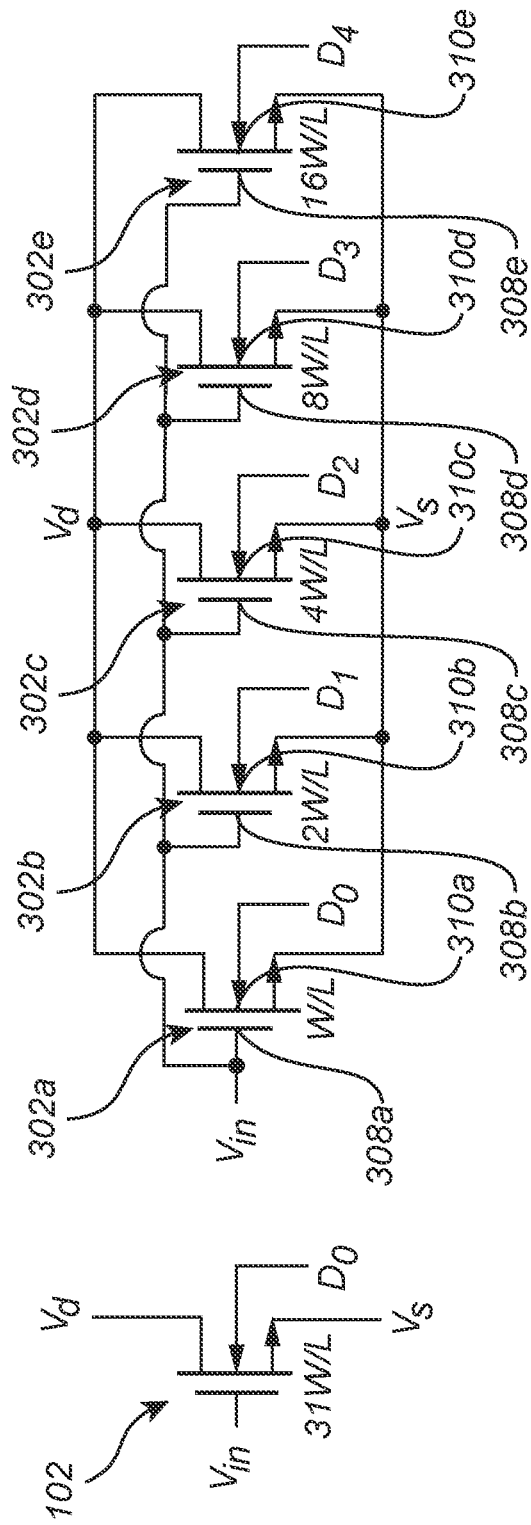
FIG. 3 is a schematic view comparing a set of input transistors according to an embodiment to a single input transistor.

Referring now to FIG. 3, a set of input transistors 302*a-e* may be used instead of a single input transistor 102. FIG. 3 illustrates a single transistor 102 at a left side of FIG. 3, which may be replaced by the set of input transistors 302*a-e* illustrated at a right side of FIG. 3.

Thus, a dimension of the channel of the input transistor 102 may be split into a plurality of input transistors 302*a-e*, which together have a corresponding dimension as the single transistor 102. Here, it is illustrated that the single input transistor 102 has a dimension corresponding to 31W/L, where W is a width of the channel and L is a length of the channel. This dimension of the input transistor 102 may be split into five input transistors 302*a-e*, each being provided with a different share of the overall dimension of the input transistors 302*a-e*. By splitting the input transistor 102 into several transistors 302*a-e*, the overall size of the input circuitry 100 is not affected, but resolution of the digital signal is improved.

With the embodiment shown on the right hand side of FIG. 3, a multi-bit digital value to be provided to the input circuitry 100 may be split so as to provide a digital signal based on a unique bit in the multi-bit digital value to each of the input transistors 302*a-e* in the set.

As shown in FIG. 3, each of the input transistors 302*a-e* receives the analog input signal on the gate terminal 308*a-e*. The drain terminals and the source terminals of the input transistors 302*a-e* are each also connected to the same node, $V_d$ and $V_s$, respectively.

The input transistors 302*a-e* receive different digital signals on the bulk terminals 310*a-e*, each digital signal being dependent on the bit value of a respective unique bit in the multi-bit digital value provided to the set of input transistors 302*a-e*. The digital signals as such may be set to one of two possible values depending on the bit value. Thus, each input transistor 302*a-e* may receive a digital signal corresponding to $D_{out}*V_{ref}$, wherein the value of $D_{out}$ depends on the bit value. However, since the channels of the input transistors 302*a-e* have different dimensions, an effect of the digital signal received on the respective input transistor 302*a-e* may differ between the input transistors 302*a-e*. In this regard, the channels of the input transistors 302*a-e* may be uniquely dimensioned such that the effect provided by each of the input transistors 302*a-e* in the set is adapted to a significancy of the bit received by the respective input transistors 302*a-e*. This allows the set of input transistors 302*a-e* to provide multi-bit digital-to-analog conversion, without need for additional components for providing digital-to-analog conversion.

As indicated in FIG. 3, the input transistors 302*a-e* in the set may be scaled such that the input transistors 302*a-e* form a sequence of increasing dimensions of the channels. The dimensions may be doubled for each increase in dimension of the channels forming a binary scaling of the input transistors 302*a-e* in the set. Thus, in relation to the single input transistor 102 having a dimension corresponding to 31W/L, the dimensions of the channels for the five input transistors 302*a-e* may be W/L, 2W/L, 4W/L, 8W/L and 16W/L to provide an equally large total area of the input transistors 302*a-e*.

As channel width is increased, the voltage on the bulk terminal 310*a-e* will have a larger effect on the output from the set of input transistors 302*a-e*. Hence, the bit value of a least significant bit, indicated by D0 in FIG. 3, may be provided to the bulk terminal 310*a* of the smallest input transistor 302*a*, and bit values of increasing significance may be provided to bulk terminals of input transistors with increasing channel size such that the bit value of a most significant bit, indicated by D4 in FIG. 3, may be provided to the bulk terminal 310*e* of the largest input transistor 302*e*.

It should however be realized that channel size of the input transistors 302*a-e* may not necessarily be doubled between subsequent input transistors 302*a-e* in the sequence. Rather, another relation between channel sizes may be used, such as using a sub-binary radix, which may be useful to introduce redundancy into the digital-to-analog conversion provided by the set of input transistors 302*a-e*. Also, the channel size may not necessarily be increased by a common factor between the input transistors of each pair of subsequent input transistors in the sequence of increasing dimensions.

Figure 4:
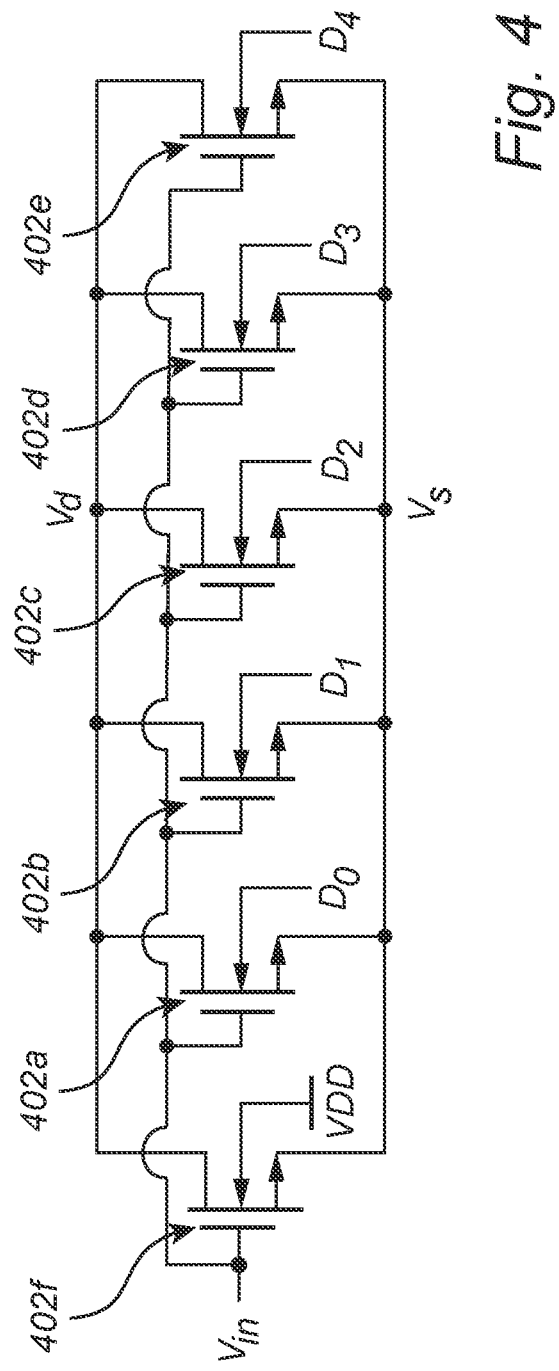
FIG. 4 is a schematic view of a set of input transistors according to another embodiment.

Referring now to FIG. 4, the set of input transistors 402*a-f* may comprise input transistors 402*a-e* forming the sequence of increasing dimensions and, in addition, the set may comprise a fixed-bias input transistor 402*f*.

Whenever a switching between the levels of the digital signal occurs at the bulk terminal of an input transistor, there may be a significant bulk-to-gate coupling. This coupling may be alleviated by using the fixed-bias input transistor 402*f* and scaling the dimensions of the other input transistors 402*a-e* accordingly. Hence, dimensions of the other input transistors 402*a-e* may be smaller to reduce an effect of the bulk-to-gate coupling.

The dimensions of the channel of the fixed-bias input transistor 402*f* may be set and the other input transistors 402*a-e* may be scaled such that flicker noise is maintained in relation to the set of input transistors 302*a-e* shown in FIG. 3.

reference voltage, such as supply voltage VDD, may be used as the fixed bias of the fixed-bias input transistor 402*f*.

The fixed-bias input transistor 402*f* may be used for setting the linear input range of the input circuitry 100. By changing the width to length ratio of the fixed-bias input transistor 402*f*, while keeping a product of width*length fixed, the linear input range may be tuned.

The scaled input range of the set of input transistors 402*a-f* may be given by Range=$[A/(A+B)](g_{mb}/g_m)V_{REF}$, where A is a sum of sizes of the set of input transistors 402*a-e*, B is a size of the fixed-bias input transistor 402*f*, $g_{mb}$ and $g_m$ is transconductance of the input transistors in relation to a signal on the bulk terminal and the gate terminal, respectively.

Figure 5:
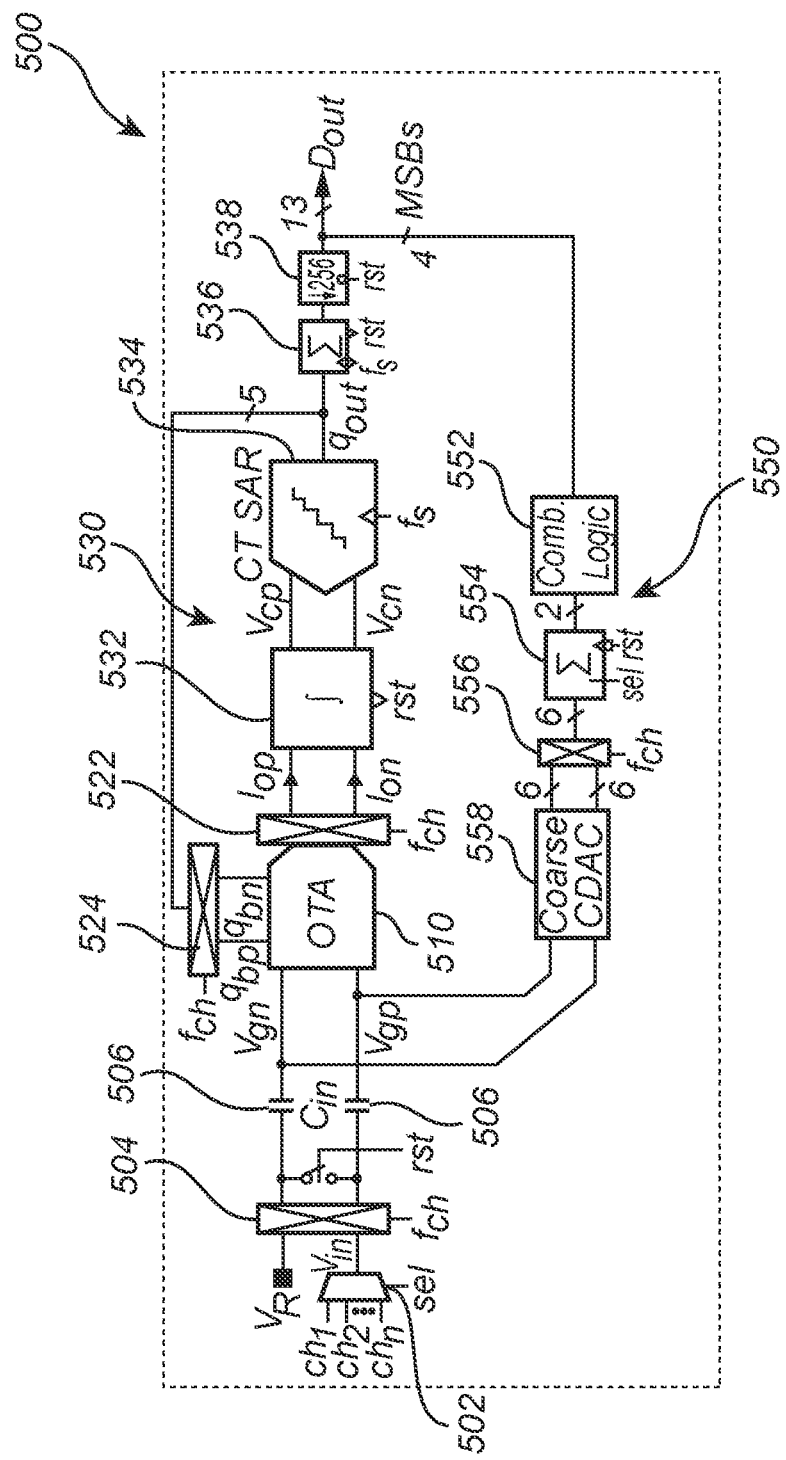
FIG. 5 is a schematic view of a read-out circuit according to an embodiment.

Referring now to FIG. 5, a read-out circuit 500 for reading an analog input signal will be described. The read-out circuit 500 is configured to provide analog-to-digital conversion of the analog input signal.

The read-out circuit 500 may be configured to receive a differential input signal, which may be based on input from a sensing electrode, $V_{in}$, and a reference electrode, $V_R$.

The read-out circuit 500 may comprise a multiplexing unit 502, which is configured to receive a plurality of input signals from sensors, such as electrodes, the plurality of input signals forming input channels. The multiplexing unit 502 may be configured to sequentially select one of the input channels to be provided as input to the read-out circuit 500. Thus, the read-out circuit 500 may support analog-to-digital conversion of input signals provided in a plurality of input channels.

The read-out circuit 500 may comprise an input chopper 504 for upmodulating the input signals. Thus, input chopping is provided to mitigate flicker noise, allow an area of input transistors 102 to be reduced, and improve common-mode rejection ratio.

The input chopper 504 may output a chopped signal to an operational transconductance amplifier (OTA) 510. The OTA 510 is further illustrated in FIG. 6 showing a transistor-level schematic of the OTA 510 according to an embodiment.

The read-out circuit 500 may comprise capacitors 506 between the input chopper 504 and the OTA 510. The capacitors 506 allow biasing input of the OTA 510 independently from an input common-mode voltage of the read-out circuit 500.

Figure 6:
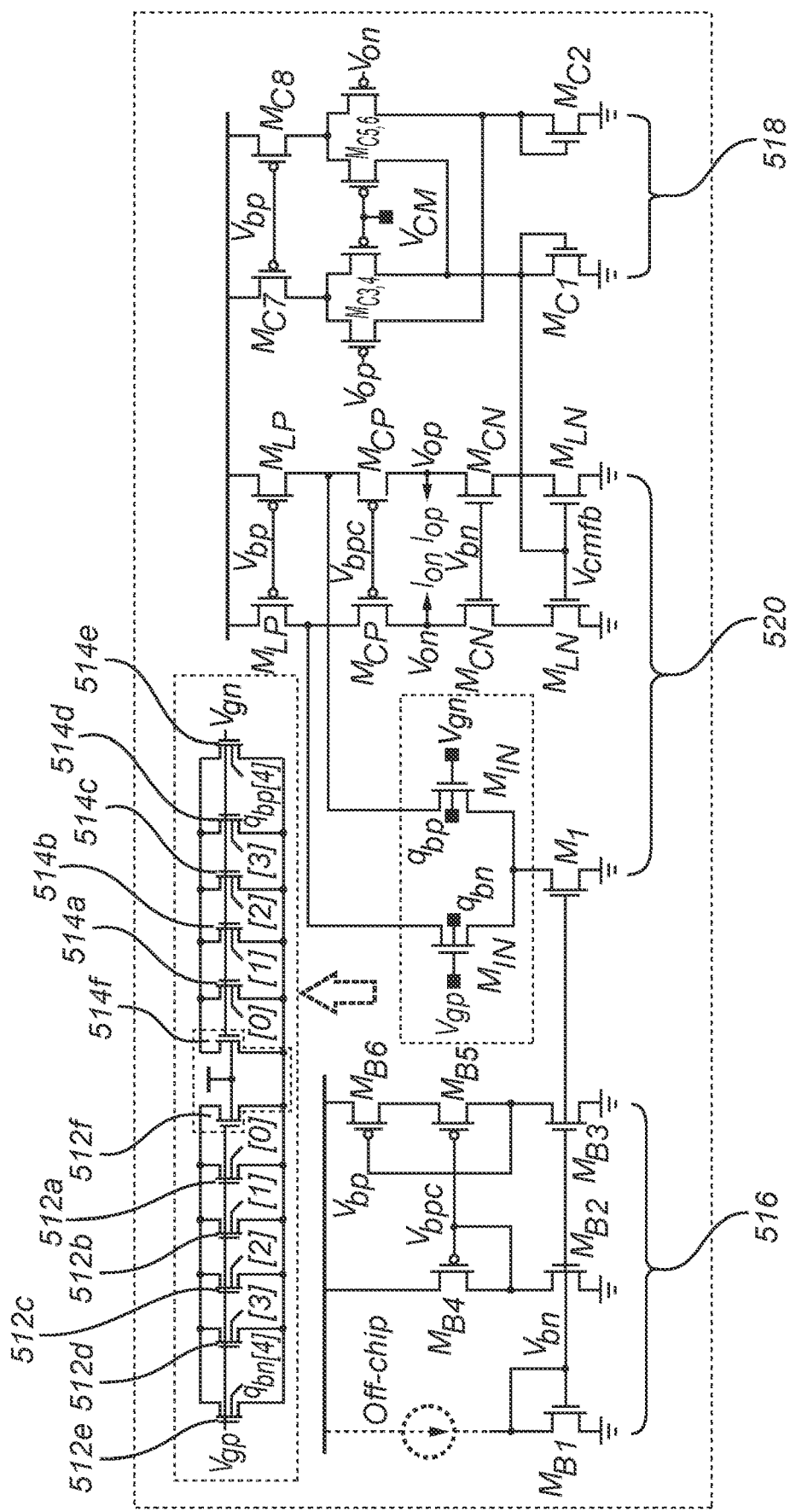
FIG. 6 is a schematic view of an operational transconductance amplifier of the read-out circuit according to an embodiment.

As shown in FIG. 6, the OTA 510 is a fully differential amplifier receiving a differential input and providing a differential output. The OTA 510 comprises a first set of input transistors 512a-f and a second set of input transistors 514a-f, wherein the first set and the second set receive a respective signal of the differential input. The OTA 510 is illustrated with each of the first and the second set of input transistors 512a-f, 514a-f being implemented in line with the set of input transistors 402a-f described above in relation to FIG. 4. However, it should be realized that the OTA 510 may use another implementation of the input transistors according to any of the above-described embodiments, using a set of input transistors or a single input transistor for each of the signals of the differential input.

As shown in FIG. 6, input transistors 512a-f receive a first analog input signal $V_{gp}$ on the gate terminals of the input transistors 512a-f. Further, input transistors 512a-e receive a digital feedback signal $q_{bn}$ on the bulk terminals, with each input transistor 512a-e receiving a respective digital feedback signal based on a unique bit in a multi-bit digital value. Input transistors 514a-f receive a second analog input signal $V_{gn}$ on the gate terminals of the input transistors 514a-f. Further, input transistors 514a-e receive a digital feedback signal $q_{bp}$ on the bulk terminals, with each input transistor 514a-e receiving a respective digital feedback signal based on a unique bit in a multi-bit digital value.

The digital feedback signal is connected to the first and second sets of input transistors 512a-f, 514a-f such that a feedback signal associated with a first signal of the differential input on the first set of input transistors 512a-f is fed back to the bulk terminal of the second set of input transistors 514a-f and vice versa. This corresponds to determining a difference of the differential input and the feedback signal.

As shown in FIG. 6, the OTA 510 may further comprise a biasing circuit 516, which may be shared for multiple OTAs of a read-out circuit having multiple channels. Also, the OTA 510 may comprise a common-mode feedback circuit 518.

The OTA 510 comprises a folded cascode amplifier 520. However, it should be realized that other amplifier arrangements may be used instead.

Although the OTA 510 is described as being part of the read-out circuit 500, it should be realized that the OTA 510 may be used in other implementations and not necessarily be incorporated in the particular read-out circuit 500 described herein.

The read-out circuit 500 may further comprise an additional chopper 522 for downmodulating the signal corresponding to the upmodulation performed by the input chopper 504.

The read-out circuit 500 may further comprise an ADC circuit 530, which is configured to form a digital representation of the input signals from sensors, such as electrodes. The signal from the additional chopper 522 may be fed to an integrator 532 of the ADC circuit 530 and further to a quantizer circuit 534.

The ADC circuit 530 may thus be configured to quantize a signal from the OTA 510 for forming a digital quantized signal. A feedback based on the digital quantized signal from the quantizer circuit 534 may be provided to the OTA 510 on the bulk terminal of the input transistors 512a-e, 514a-e. A chopper 524 may be used for upmodulating the feedback to frequency range of the analog input signal in the OTA 510.

The integrator 532 of the ADC circuit 530 may be configured to integrate the analog input to the integrator 532 forming an integral of the analog input. The quantizer circuit 534 may monitor the integral and identify when the integral crosses a threshold. Each time the threshold is exceeded, a value corresponding to the threshold may be subtracted from the analog input signal for allowing identifying of the integral again crossing the threshold.

Thus, the quantizer circuit 534 may output a feedback signal to be subtracted from the analog input signal. The feedback signal may be provided to the OTA 510 on the bulk terminal of the input transistors 512a-e, 514a-e. Thanks to the use of BDAC in the input transistors 512a-e, 514a-e of the OTA 510, the ADC circuit 530 does not need to comprise any components, such as current sources, capacitors or resistors for digital-to-analog conversion. Such components may inject noise or degrade input impedance, which is thus avoided in the ADC circuit 530. Further, such components add to an overall area and/or power consumption of the ADC circuit 530, such that the ADC circuit 530 may be compact and power-efficient.

The ADC circuit 530 may further comprise a low pass filter 536, which filters the output from the quantizer circuit 534. The output of the low pass filter 536 may be passed through a decimator 538 for providing the digital output representing the analog input signal.

As described above, the ADC circuit 530 may thus implement a sigma-delta ADC.

The ADC circuit 530 may be configured to provide an incremental sigma-delta ADC. Thus, before start of each conversion, a reset is applied to clear any memory effects of previous conversions, as indicated by "rst" in FIG. 5. This is particularly useful when a multiplexed input for receiving a plurality of input channels is used. Then, reset ensures that any memory effect from previously processed signals originating from another electrode is cleared.

Figure 7:
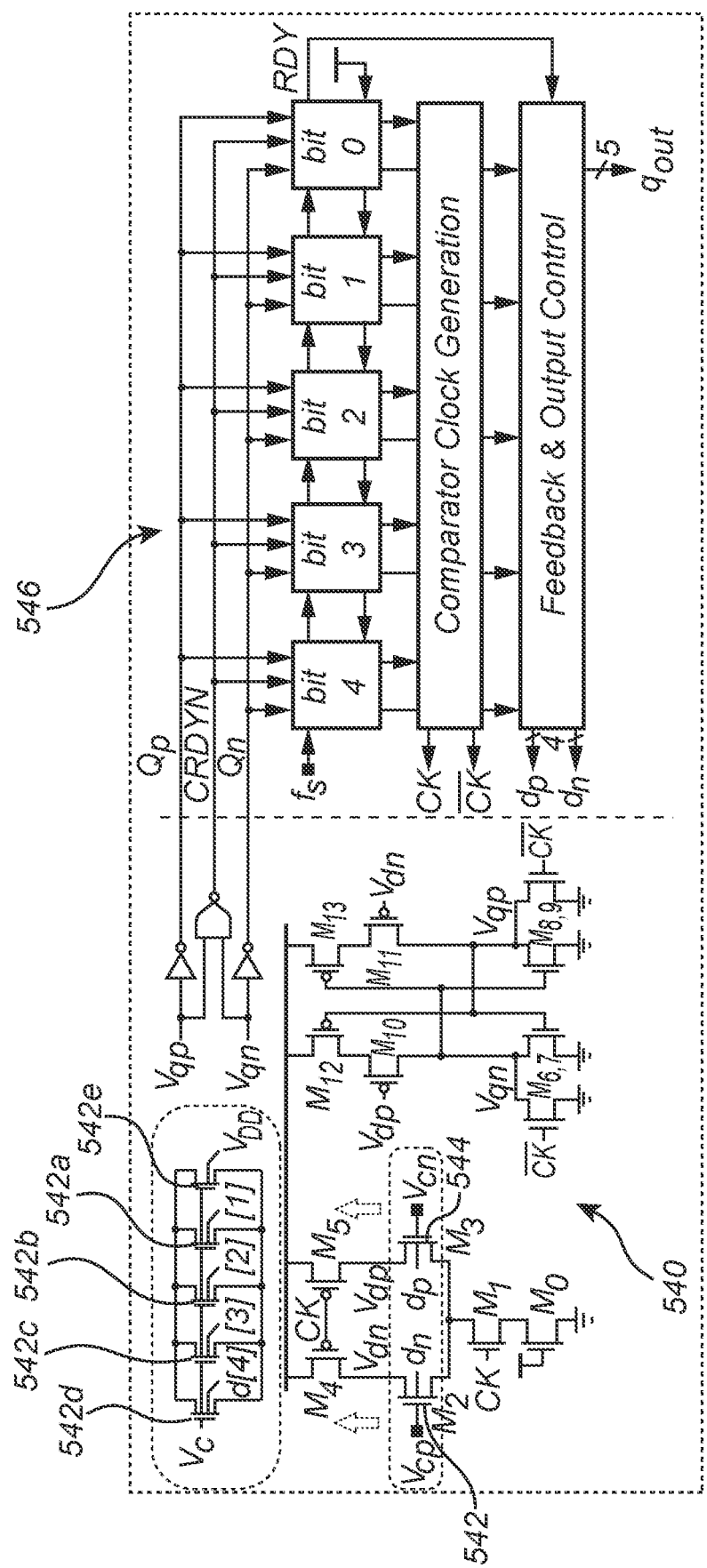
FIG. 7 is a schematic view of a quantizer circuit of the read-out circuit according to an embodiment.

Referring now to FIG. 7, the quantizer circuit 534 according to an embodiment will be described in further detail. The quantizer circuit 534 is configured to output a multi-bit digital value. However, it should be realized that the quantizer circuit 534 may alternatively provide a single bit, such that the quantizer circuit 534 compares the integral to a single threshold.

The quantizer circuit 534 is a continuous time quantizer circuit, which implies that no sample and hold circuit is used. This implies that overshoots in the quantizer circuit 534 after an instant of a reset event when the ADC circuit 530 is configured in incremental mode may be alleviated.

The quantizer circuit 534 may be seen as a comparator circuit and comprises a comparator 540, which receives a differential analog input signal $V_{cp}$, $V_{cn}$ on gate terminals of a first set 542 of input transistors 542a-e and a second set 544 of input transistors. The first set 542 of input transistors 542a-e is illustrated in FIG. 7, but it should be realized that the second set 544 of input transistors may be implemented in a corresponding manner. The comparator 540 is illustrated with the first set 542 of input transistors 542a-e being implemented in line with the set of input transistors 402a-e described above in relation to FIG. 4, with input transistors 542a-d receiving four most significant bits of a digital threshold signal on the bulk terminals and a fixed bias being provided on the bulk terminal of the input transistor 542e. However, it should be realized that the comparator 540 may use another implementation of the input transistors according to any of the above-described embodiments, using a set of input transistors or a single input transistor for each of the signals of the differential input.

The first set 542 of input transistors 542a-e receive a first analog input signal $V_{cp}$ on the gate terminals of the input transistors 542a-e. Further, input transistors 542a-d receive a digital threshold signal $d_n$ on the bulk terminals, with each input transistor 542a-d receiving a respective digital threshold value based on a unique bit in a multi-bit digital value. The second set 544 of input transistors receive a second analog input signal $V_{cn}$ on the gate terminals of the input transistors. Further, input transistors receive a digital feedback signal $d_p$ on the bulk terminals, with each input transistor receiving a respective digital threshold value based on a unique bit in a multi-bit digital value.

The comparator 540 is configured to compare the differential analog input signal $V_{cp}$, $V_{cn}$ to the digital threshold signal $d_p$, $d_n$ and the comparator 540 provides an output $V_{qp}$, $V_{qn}$.

The output of the comparator 540 is provided to a successive approximation register (SAR) logic 546. The SAR logic 546 may be implemented with asynchronous control, such that quantization delay may be reduced to suppress overshoot after an incremental reset occurs. The SAR logic 546 may further incorporate dynamic logic in the asynchronous control, which may further reduce quantization delay.

The SAR logic 546 comprises five registers each representing a unique bit in a five-bit digital value. The SAR logic 546 is configured to set the bit value of each register in dependence of the output from the comparator 540 and may sequentially determine values for the bits based on the output from the comparator 540, starting at a most significant bit and then sequentially determining the values of increasingly less significant bits in further iterations of comparing the analog input value to the digital threshold value provided by the SAR logic 546. Hence, the SAR logic 546 may set the multi-bit digital value represented by the registers and the SAR logic 546 outputs the four most significant bits of the multi-bit digital value to the bulk terminals of the sets 542, 544 of input transistors of the comparator 540. The input transistors thus provide a BDAC saving area of the quantizer circuit 534.

At an end of conversion by the quantizer circuit 534, a digital output value gout is output from the SAR logic 546.

Although the comparator 540 is described as being part of the read-out circuit 500 and being part of the quantizer circuit 534, it should be realized that the comparator 540 may be used in other implementations and not necessarily be incorporated in the particular read-out circuit 500 or the particular quantizer circuit 534 described herein.

Referring again to FIG. 5, the digital output from the decimation filter 538 may further be provided to a feedback unit 550 for electrode offset compensation.

The feedback unit 550 may comprise a combinational logic circuit 552, which is configured to compare the output from the decimation filter 538 to a programmable upper and lower boundary. Thus, if the output drifts outside a linear range of the ADC circuit 530, an accumulator 554 corresponding to a respective input channel is updated.

The output from the accumulator 554 may be passed to a chopper 556 for upmodulating the feedback to frequency range of the analog input signal in the OTA 510. The feedback may then further be converted to an analog signal through a capacitive DAC 558, which may be combined with the analog input signal to the OTA 510 for providing electrode offset compensation.

Figure 8:
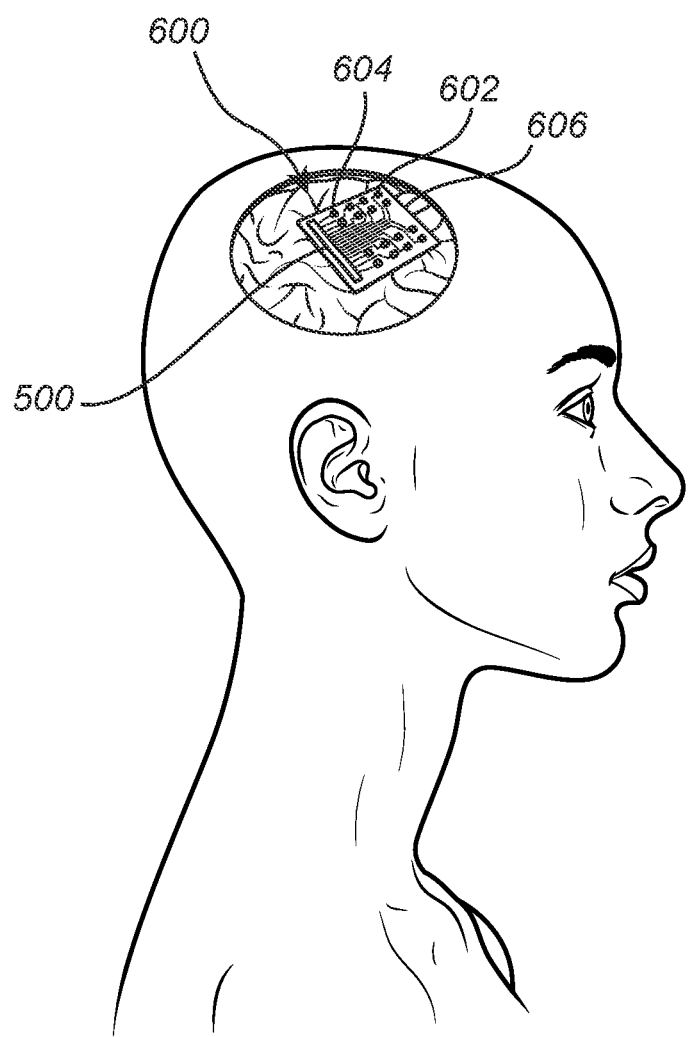
FIG. 8 is a schematic view of a biopotential signal sensor according to an embodiment.

Referring now to FIG. 8, a biopotential signal sensor 600 according to an embodiment will be described.

The biopotential signal sensor 600 comprises at least one electrode 602 configured for sensing a biopotential signal. The biopotential signal sensor 600 further comprises the read-out circuit 500. The read-out circuit 500 may be configured to receive an input signal from the electrode 602 in the form of a biopotential signal from the at least one electrode 602 and to read out the biopotential signal by the read-out circuit 500 to form a digital representation of the biopotential signal.

The biopotential signal sensor 600 may comprise a first and a second electrode 602, 604, wherein the first electrode 602 is configured to sense the biopotential and the second electrode 604 is connected to a reference potential to provide a differential input signal to the read-out circuit 500.

According to another embodiment, the biopotential signal sensor may comprise one electrode, which is configured to sense the biopotential. The signal from the electrode may then be read out in relation to a reference potential, which may be directly provided to the read-out circuit 500.

It should further be realized that the biopotential signal sensor may comprise an array of sensor read-out circuits 500 for reading out signals from a plurality of electrodes. As a further alternative, the plurality of electrodes may be sequentially connected through the multiplexing unit 502 to the ADC circuit 530 such that the ADC circuit 530 may support readout and analog-to-digital conversion of biopotential signals from a plurality of electrodes. The read-out circuit 500 may be connected to one reference electrode or a reference potential during the sequence of reading out biopotential signals from the plurality of electrodes, such that the reference electrode/reference potential is shared by the plurality of electrodes. It should further be realized that the biopotential signal sensor 600 may comprise an array of sensor read-out circuits 500, wherein each read-out circuit 500 is connected to a plurality of electrodes such that each read-out circuit 500 supports reading out signals from a plurality of electrodes.

The at least one electrode 602 may be any type of electrode 602 which is configured to sense an electrical potential at a location of the electrode 602. The electrode 602 may therefore comprise a conducting part which is configured to sense the electrical potential. The electrode 602 could be adapted to be used for sensing biopotential, i.e. an electrical potential in a body of a human being or an animal.

The biopotential signal sensor 600 may be configured to be worn by a subject. The biopotential signal sensor 600 may thus comprise a carrier configured for attachment to the subject or for arrangement around a body part of the subject. For instance, the biopotential signal sensor 600 may comprise a patch 606 for attaching the biopotential signal sensor 600 to the subject. According to an embodiment, the biopotential signal sensor 600 may be configured to sense a biopotential signal relating to electrocorticography. In such case, the carrier may be configured for placing the biopotential signal sensor 600 directly on an exposed surface of a brain of the subject.

The biopotential signal sensor 600 may comprise further processing circuitry for further processing of the biopotential signals read out by the read-out circuit 500. Thus, the biopotential signal sensor 600 may provide analysis of the biopotential signals.

The biopotential signal sensor 600 may also or alternatively comprise a communication unit for wired or wireless communication to a remote unit for further processing of the biopotential signals. The biopotential signal sensor 600 may communicate the biopotential signals output by the read-out circuit 500 to the remote unit or may further process the biopotential signals before communicating the further processed signals to the remote unit.

The biopotential signal sensor 600 may for instance be configured to sense a biopotential signal relating to electrocardiography, electroencephalography, electrocorticography, or electromyography.

The read-out circuit 500 may be provided in a small area so as to achieve a compact read-out circuit 500. This may facilitate having a small size biopotential signal sensor 600 and may support small size electrodes 602 being used in the sensing of the biopotential signal.

Further, thanks to the use of BDAC in the read-out circuit 500, separate components for digital-to-analog conversion are not needed. Such components may inject noise or degrade input impedance, which is thus avoided in the read-out circuit 500 providing improved quality of acquisition of the biopotential signals.

Figure 9:
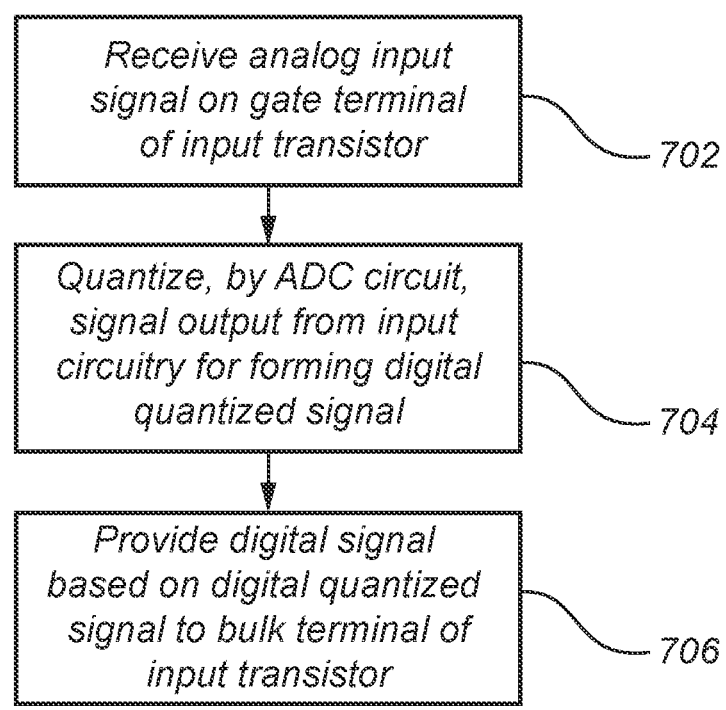
FIG. 9 is a flow chart of a method according to an embodiment.

Referring now to FIG. 9, a method for reading an analog input signal will be described.

The method comprises receiving 702 the analog input signal on a gate terminal of an input transistor of an input circuitry. A signal output by the input circuitry may be passed to an ADC circuit for converting the analog input signal to a digital representation.

The method further comprises quantizing 704, by the ADC circuit, the signal output from the input circuitry for forming a digital quantized signal. The quantizing may be performed based on an integral of the signal output by the input circuitry, such that the digital quantized signal may indicate when the integral exceeds a threshold.

The quantizing of the signal from the input circuitry may comprise receiving an integrated signal on gate terminals of a set of quantizer input transistors. The quantizing may further comprise comparing the integrated signal to a respective reference signal received on a bulk terminal of each quantizer input transistor in the set of quantizer input transistors, wherein the reference signal received by each of the quantizer input transistors is based on a unique bit in a multi-bit digital value from a SAR logic. Thus, the quantizing of the signal may be based on a multi-bit SAR for providing a multi-bit output from quantizing.

The method may further comprise providing 706 a digital signal based on the digital quantized signal to a bulk terminal of the input transistor. Thus, a feedback may be provided to the input transistor. The feedback may correspond to the threshold of a quantizer, such that the threshold is subtracted from the analog input signal each time the integral exceeds the threshold. The digital quantized signal may further be provided to a decimation filter for providing a digital representation of the analog input signal.

Thanks to the digital signals being provided to bulk terminals of input transistors, digital-to-analog conversion of the digital signals may be provided by the input transistors forming BDACs. This implies that separate components for digital-to-analog conversion are not needed. Such components may inject noise or degrade input impedance, which is thus avoided in the method.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. An input circuitry for receiving an analog input signal, said input circuitry comprising:
    an input transistor, which is configured to receive the analog input signal on a gate terminal of the input transistor;
    wherein the input transistor is connected to a digital component providing a digital signal, and wherein the input transistor is configured to receive the digital signal on a bulk terminal of the input transistor;
    wherein the input transistor is configured to provide an output current based on the analog input signal and the digital signal, such that the input transistor provides digital-to-analog conversion of the digital signal received on the bulk terminal,
    wherein the input circuitry comprises a set of input transistors, wherein each input transistor in the set is configured to receive the analog input signal on the respective gate terminal of the input transistor, wherein each input transistor in the set of input transistors is configured to receive a respective digital signal on the respective bulk terminal based on a unique bit in a multi-bit digital value.

2. The input circuitry according to claim 1, wherein channels of the input transistors in the set of input transistors are uniquely dimensioned such that the input transistors form a sequence of increasing dimensions of the channels and wherein the dimensions of the input transistors is adapted to the bit received by the respective input transistors.

3. The input circuitry according to claim 1, wherein the set of input transistors further comprises a fixed-bias input transistor, which is configured to receive the analog input signal on the gate terminal of the input transistor and configured to receive a fixed reference voltage on the bulk terminal.

4. The input circuitry according to claim 1, wherein the input circuitry is formed by fully depleted silicon on insulator, FDSOI, technology.

5. An operational transconductance amplifier comprising the input circuitry according to claim 1.

6. The operational transconductance amplifier according to claim 5, comprising:
    a first input circuitry for receiving an analog input signal, said input circuitry comprising:
    an input transistor, which is configured to receive the analog input signal on a gate terminal of the input transistor;
    wherein the input transistor is connected to a digital component providing a digital signal, and wherein the input transistor is configured to receive the digital signal on a bulk terminal of the input transistor;

wherein the input transistor is configured to provide an output current based on the analog input signal and the digital signal, such that the input transistor provides digital-to-analog conversion of the digital signal received on the bulk terminal; and a second input circuitry for receiving an analog input signal, said input circuitry comprising:

an input transistor, which is configured to receive the analog input signal on a gate terminal of the input transistor;

wherein the input transistor is connected to a digital component providing a digital signal, and wherein the input transistor is configured to receive the digital signal on a bulk terminal of the input transistor;

wherein the input transistor is configured to provide an output current based on the analog input signal and the digital signal, such that the input transistor provides digital-to-analog conversion of the digital signal received on the bulk terminal;

wherein the first input circuitry and the second input circuitry are configured to receive a differential analog input signal.

7. A comparator circuit for processing an analog input signal, said comparator circuit comprising:

the input circuitry according to claim 1;

wherein the input transistor of the input circuitry is configured to receive the digital signal based on one or more digital thresholds, wherein the input transistor is configured to form a comparator for comparing the analog input signal to the digital signal.

8. The comparator circuit according to claim 7, comprising a first input circuitry for receiving an analog input signal, said input circuitry comprising:

an input transistor, which is configured to receive the analog input signal on a gate terminal of the input transistor;

wherein the input transistor is connected to a digital component providing a digital signal, and wherein the input transistor is configured to receive the digital signal on a bulk terminal of the input transistor;

wherein the input transistor is configured to provide an output current based on the analog input signal and the digital signal, such that the input transistor provides digital-to-analog conversion of the digital signal received on the bulk terminal; and a second input circuitry for receiving an analog input signal, said input circuitry comprising:

an input transistor, which is configured to receive the analog input signal on a gate terminal of the input transistor;

wherein the input transistor is connected to a digital component providing a digital signal, and wherein the input transistor is configured to receive the digital signal on a bulk terminal of the input transistor;

wherein the input transistor is configured to provide an output current based on the analog input signal and the digital signal, such that the input transistor provides digital-to-analog conversion of the digital signal received on the bulk terminal;

wherein the first input circuitry and the second input circuitry are configured to receive a differential analog input signal.

9. An analog-to-digital converter, ADC, circuit for converting an analog input signal into a digital representation, said ADC circuit comprising:

a quantizer circuit configured to quantize a signal based on the analog input signal, wherein the quantizer circuit includes the input circuitry according to claim 1.

10. The ADC circuit according to claim 9, wherein the quantizer circuit includes a successive approximation register, SAR, logic.

11. An analog-to-digital converter, ADC, circuit for converting an analog input signal into a digital representation, said ADC circuit comprising:

the input circuitry according to claim 1; and a quantizer circuit, wherein the quantizer circuit is configured to quantize a signal from the input circuitry for forming a digital quantized signal, and wherein the input transistor of the input circuitry is configured to receive the digital signal on the bulk terminal based on the digital quantized signal.

12. The ADC circuit according to claim 11, wherein the ADC circuit comprises an integrator configured to receive a signal from the input circuitry and wherein the quantizer circuit is configured to receive a signal from the integrator.

13. A read-out circuit for reading an analog input signal, wherein the read-out circuit comprises an ADC circuit according to claim 9 and further comprises at least one chopper (504) configured to provide input chopping for chopper stabilization.

14. A biopotential signal sensor for acquisition of a biopotential signal, said biopotential signal sensor comprising:

at least one electrode configured for sensing the biopotential signal, and the read-out circuit according to claim 13, wherein the read-out circuit is connected to the at least one electrode for receiving the biopotential signal sensed by the at least one electrode as the analog input signal to the read-out circuit.

15. A method for reading an analog input signal, said method comprising:

receiving the analog input signal on a gate terminal of an input transistor of an input circuitry according to claim 1;

quantizing, by an analog-to-digital converter (ADC) circuit, a signal from the input circuitry for forming a digital quantized signal; and providing a digital signal based on the digital quantized signal to a bulk terminal of the input transistor.

* * * * *